United States Patent
Stein et al.

(10) Patent No.: US 10,355,706 B1
(45) Date of Patent: Jul. 16, 2019

(54) EQUALIZATION OF SUB-DAC FREQUENCY RESPONSE MISALIGNMENTS IN TIME-INTERLEAVED HIGH-SPEED DIGITAL TO ANALOG CONVERTERS

(71) Applicant: Guzik Technical Enterprises, Mountain View, CA (US)

(72) Inventors: Anatoli B. Stein, Atherton, CA (US); Semen P. Volfbeyn, Palo Alto, CA (US); Alexander Taratorin, Palo Alto, CA (US); Valeriy Serebryanskiy, Santa Clara, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 16/202,341

(22) Filed: Nov. 28, 2018

(51) Int. Cl.
*H03M 1/06* (2006.01)
*H03M 1/10* (2006.01)

(52) U.S. Cl.
CPC ....... *H03M 1/1033* (2013.01); *H03M 1/0612* (2013.01); *H03M 1/1085* (2013.01)

(58) Field of Classification Search
CPC ............. H03M 1/1033; H03M 1/1085; H03M 1/0612; H03M 1/12; H03M 1/06; H03M 1/203; H03M 1/207; H03M 1/66; H03M 1/747
USPC ................................. 341/118, 155, 156, 144
See application file for complete search history.

(56) References Cited

U.S. PATENT DOCUMENTS

| | | | | |
|---|---|---|---|---|
| 5,668,831 | A * | 9/1997 | Claydon | H03K 5/24 348/E5.003 |
| 5,910,960 | A * | 6/1999 | Claydon | H03K 5/24 348/E5.108 |
| 6,166,601 | A * | 12/2000 | Shalom | H03F 1/3229 330/149 |
| 7,084,794 | B2 | 8/2006 | Chang et al. | |
| 7,167,515 | B2 * | 1/2007 | Kelly | H04H 60/04 375/229 |

(Continued)

*Primary Examiner* — Jean B Jeanglaude
(74) *Attorney, Agent, or Firm* — Burns & Levinson, LLP; Joseph M. Maraia

(57) ABSTRACT

A method and system for calibrating a time-interleaved digital to analog converter (DAC) provides equalization of frequency response misalignments in sub-DACs forming the DAC. In a calibration mode, test signals are applied to an DAC and output amplitudes and phases of are measured. From the measured values, complex values of the gains of the respective sub-DACs. $h_m(F)$ are determined and a specified target frequency response $T(F)$ for a tandem connection equalizer-DAC is determined. For each of a plurality of test frequencies, complex values of equalizer gains $Eq_m$ are determined from $Eq_m(F)=T(F)/h_m(F)$, to form equalizing frequency responses. Sets of equalizing coefficients $C_m(p)$ pursuant to discrete Fourier transforms on $Eq_m(F)$. In an operation mode, a digital input signal is transformed input into an equalized digital signal $E(n)$ through use of the sets of equalizing coefficients $C_m(p)$.

8 Claims, 11 Drawing Sheets

(56) References Cited

U.S. PATENT DOCUMENTS

| | | | | |
|---|---|---|---|---|
| 7,173,966 | B2* | 2/2007 | Miller | H04K 1/00 |
| | | | | 375/229 |
| 7,684,480 | B2* | 3/2010 | Kelly | H04H 60/04 |
| | | | | 375/229 |
| 8,125,361 | B2 | 2/2012 | Choe et al. | |
| 8,134,486 | B2 | 3/2012 | Lai et al. | |
| 9,007,250 | B1 | 4/2015 | Jeraj et al. | |
| 9,509,331 | B1* | 11/2016 | Pagnanelli | H03M 3/358 |
| 9,680,497 | B2* | 6/2017 | Pagnanelli | H03M 3/40 |
| 9,685,969 | B1 | 6/2017 | Garg et al. | |
| 9,735,800 | B2* | 8/2017 | Pagnanelli | H03M 3/358 |
| 9,973,293 | B2 | 5/2018 | Damnjanovic et al. | |
| 2006/0088085 | A1* | 4/2006 | Kelly | H04H 60/04 |
| | | | | 375/229 |
| 2007/0133669 | A1* | 6/2007 | Kelly | H04H 60/04 |
| | | | | 375/229 |
| 2017/0077945 | A1* | 3/2017 | Pagnanelli | H03M 3/40 |

\* cited by examiner

US 10,355,706 B1

EQUALIZATION OF SUB-DAC FREQUENCY RESPONSE MISALIGNMENTS IN TIME-INTERLEAVED HIGH-SPEED DIGITAL TO ANALOG CONVERTERS

TECHNICAL FIELD

The present disclosure relates generally to digital to analog convertors (DACs), and more particularly to suppression of spurious frequency components in time-interleaved DACs, which are due to misalignments of frequency responses between different sub-DACs of the DACs.

BACKGROUND

Digital to analog converters (DACs) provide a basis for design of arbitrary waveform generators, as well as a wide variety of measuring devices, and have gained widespread acceptance in broadband communications applications.

To achieve relatively high speed and large bandwidth characteristics for a DAC operating at a given frequency, the DAC may be built as a composition of a number M of sub-DACs, with each sub-DAC operating at a frequency which is reduced by a factor of M from the given frequency. Such DACs are known as composite DACs in the art, sometimes referred to as time-interleaved DACs. A block diagram of an exemplary conventional composite DAC is shown in FIG. 1 (see, for example U.S. Pat. Nos. 9,007,250, 9,973,293 and others). In use, for the DAC of FIG. 1, a digital input signal at a digital input 12 associated with a sampling frequency $F_s$ for the DAC, is applied to a demultiplexer. The demultiplexer splits the input signal into M partial data streams. Each partial data stream has an associated sampling frequency $F_s/M$ and is applied to the input of an associated one of the sub-DACs #1-#M. Each sub-DAC converts its received partial digital stream into an analog signal. The outputs of all sub-DACs #1-#M are connected to associated inputs of a combiner. The combiner passes over to its output, the signal from one of its inputs after another, in succession, forming in that way, a combined signal. The output of the combiner is connected to the input of a filter with a passband that corresponds to the operative band of the DAC in the first Nyquist zone. The filter smooths the signal formed in the combiner, and places that smoothed analog signal at the composite DAC output 14.

Composite DAC architectures, as just described, suffer from differences, or mismatches, in properties of the sub-DACs making up the composite DAC. The main impact of such mismatches is an appearance of spurious frequency components in the composite DAC output analog signal. The spurious frequency components are perceived as distortions of the processed signal. Those distortions diminish the spurious free dynamic range (SFDR), limiting the overall effective number of bits (ENOB) of the DAC, and should be eliminated or, at least, reduced.

There are different possible reasons for appearance of the spurious frequency components in the composite DAC output: timing misalignment, DC offset misalignment, different amplification in sub-DACs and misalignment between frequency responses $h_m(F)$ of the different sub-DACs making up the composite DAC.

The reduction of spurious frequency components in time-interleaved DAC outputs (often referred to as spurs reduction) has received reasonable amount of attention in the art. For example, U.S. Pat. No. 9,685,969 proposes a time-interleaved DAC architecture that reduces time misalignment of its sub-DACs. The U.S. Pat. No. 7,084,794 describes a method and apparatus for DAC DC offset calibration. The calibration that removes the converting elements mismatch, is treated in the U.S. Pat. No. 8,125,361. U.S. Pat. No. 8,134,486 deals with a calibration mechanism of a DAC in a sigma delta modulator. However, the problem of correction of frequency responses misalignment in multiple sub-DACs of a time-interleaved DAC, cannot be considered as solved at the present time.

In the prior art, the elimination of sub-DACs-caused frequency responses misalignment requires a calibration of the device over its full output bandwidth. The calibration typically requires preliminary measurement of the DAC features which have caused the undesirable effect. To be able to perform DAC calibration in production or operational environments, this measurement should be performed by the most simple and inexpensive measuring device, such as spectrum analyzer, producing only an improved amplitude spectrum of the processed signal.

The present disclosure describes a method and system for calibrating time-interleaved DACs which equalizes frequency response misalignments, thereby preventing spur appearance, and, importantly, which can be performed using simple spectrum analyzer as a principal measurement tool.

DETAILED DESCRIPTION

Figure 1:
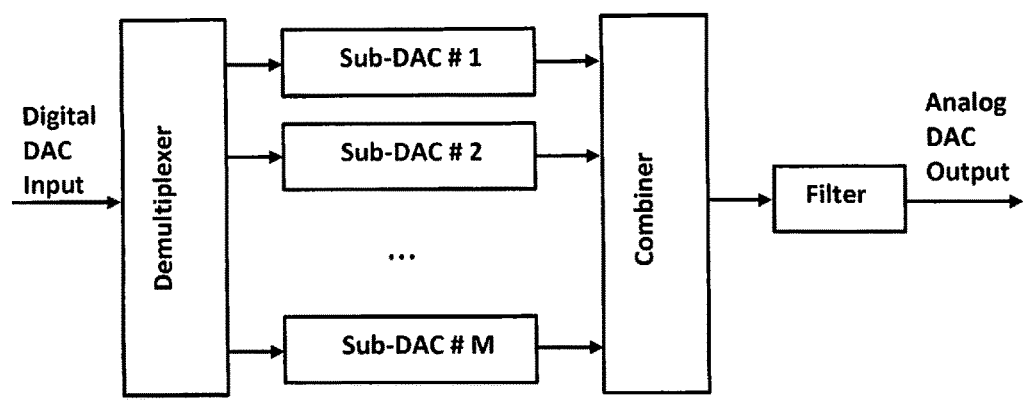
FIG. 1 shows a block diagram of a conventional time-interleaved DAC.
Figure 1A:
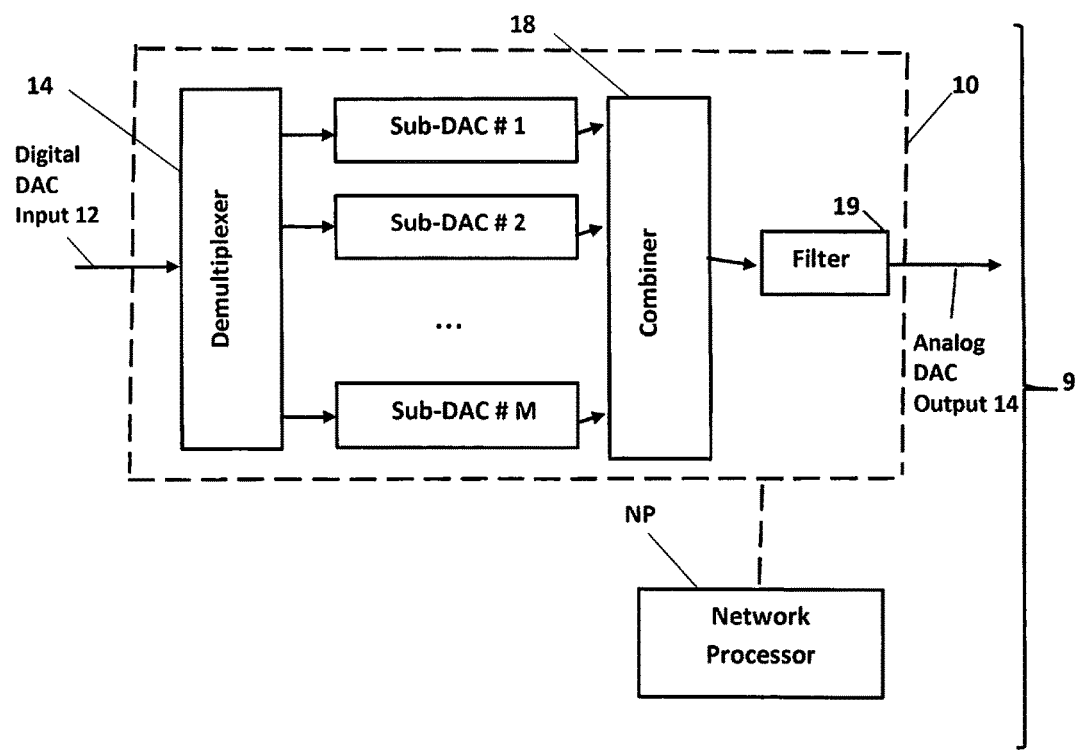
FIG. 1A shows a block diagram of an exemplary system including a time-interleaved DAC and a complementary network processor, exemplifying the disclosure.

An exemplary system 9 of the disclosure is shown in FIG. 1A. That system 9 includes a time-interleaved DAC 10 which, as illustrated, has the form of the DAC shown in FIG. 1. DAC 10 includes a digital DAC input 12 for receiving a digital signal-to-be-processed, and an analog DAC output 14 for presenting a processed analog output signal. DAC 10 includes a demultiplexer 16 having an input coupled to the digital DAC input 12 and includes M outputs connected to inputs of respective ones of M sub-DACs #1-#M. Outputs of the sub-DACs #1-#M are respectively coupled to corresponding inputs of a combiner 18. An output of combiner 18 is coupled to an input of a filter 19. An output of filter 19 provides the processed analog output signal to analog DAC output 14. System 9 further includes a processor network PN coupled to the DAC 10, for processing various signals of DAC 10 as described below.

As generally described above, in operation, an input digital signal applied to the digital DAC input 12 is applied in turn to the demultiplexer 16. Demultiplexer 16 demultiplexes the applied input digital signal and provides the resultant signals to the inputs of the respective M sub-DACs #1-#M. Outputs of the M sub-DACs #1-#M are applied to combiner 18 to generate an analog output signal which is passed through filter 19 to the DAC analog output 14.

In detail, the time-interleaved DAC 10 of the disclosure comprises M sub-DACs, wherein the m-th sub-DAC (where m and M are integers, and 0≤m<M) is characterized by an amplitude frequency response $A_m(F)$ and phase frequency response $\phi_m(F)$. The values $A_m(F)$ and $\phi_m(F)$ of these responses, at a fixed frequency F, describe the complex gain $h_m(F)$ of the sub-DAC:

$$h_m(F)=A_m(F)\cdot\exp(j\cdot\phi_m(F)).$$

When a signal $s_{in}(n)=\exp(j2\pi Fn)$ is applied to the DAC input 12, an n-th sample is processed by the sub-DAC with the number m, where m=n mod M. Here, the sample is multiplied by the sub-DAC complex gain $h_m(F)$ and is converted into an output analog sample $s_{out}(n)=A_m(F)\cdot\exp(j2\pi Fn+\phi_m(F))$.

The output signal $s_{out}(n)$ may be considered as a product of the input signal Sin(n) and a periodic signal P(n):

$$s_{out}(n)=s_{in}(n)\cdot P(n),$$

where $P(n)=h_m(F)$ for m=n mod M. A Fourier transform provides for that signal, for example, provided by a processor network PN in FIG. 1A, complex amplitudes $H_k$ of the decomposition of the signal P(n) into sum of frequency components:

$$H_k = \sum_{m=0}^{M-1} P(n)\cdot\exp(-j2\pi\cdot k\cdot m/M) = \sum_{m=0}^{M-1} h_m(F)\cdot\exp(-j2\pi\cdot k\cdot m/M). \quad (1)$$

An inverse Fourier transform, for example, provided by processor network PN, reconstructs the signal P(n):

$$P(n) = h_m(F) = 1/M\cdot\sum_{K=0}^{M-1} H_k\cdot\exp(j2\pi\cdot F_k\cdot n/F_s), \quad (2)$$

where $F_k=F_s/M\cdot k$ is the frequency of the component with the number k and $F_s$ is the DAC sampling frequency.

In a form, as provided by processor network PN, a substitution of P(n) is made into the equation for $s_{out}(n)$, providing an expression for $s_{out}(n)$ in the form of a sum of exponential waveforms $$s_{out}(n) = 1/M\cdot\sum_{K=0}^{M-1} H_k\cdot\exp(j2\pi\cdot(F+F_k\cdot n/M\cdot F_s)).$$

In this sum, the addend with the index k=0 corresponds to an undistorted part of the output signal. Other addends present spurious frequency components or spurs.

A spur with the number k (1≤k<M) has the frequency $F+k\cdot F_s/M$ and equals $$Spur(k)=1/M\cdot H_k\cdot\exp(j2\pi\cdot(F+k^*n/M\cdot F_s)).$$

According to the equation (1) above, a complex amplitude $H_k$ of a spur depends on the number k of the spur, on the number M of sub-DACs in the composite DAC 10 and on the complex gains $h_m(F)$ of the m-th sub-DAC. The spur frequencies are shifted in relation to the signal frequency F by a displacement which is a multiple of the sampling frequency Fs divided by the numbers M of the sub-DACs.

According to the present disclosure, a time interleaved DAC with equalization presents a tandem connection of an equalizer and the DAC. The equalizer may be a hardware device or a software program running on a computer. The operation of the equalizer depends on the number n of the processed sample, so that it has a frequency response $Eq_m(F)$, where m=n Mod M. The tandem connection of an equalizer and the DAC has a frequency response $Eq_m(F)\cdot h_m(F)$.

An initial cause of an appearance of spurious frequency components in a time interleaved DAC is the misalignment of sub-DACs frequency responses $h_m(F)$. To prevent an appearance of the spurious frequency components, an equalization operation corrects an existing misalignment and makes the frequency responses $Eq_m(F)\cdot h_m(F)$ of the tandem connection equalizer-DAC to be the same for all m.

In a form, a time-interleaved DAC with equalization of the disclosure can work in one of two stages: in a calibration stage, or in an operation stage. In a calibration stage, a set of M equalizing frequency responses $Eq_m(F)$, 0≤m<M, is found. In an operation stage, a spectrum of an input digital signal is changed with the use of the equalizing frequency responses $Eq_m(F)$. The transformed signal is applied to the DAC input.

To make possible the equalization in a time interleaved DAC, preliminary measurements at the calibration stage, provide sufficient information for calculation of the equalizing frequency responses $Eq_m(F)$. Such information may be obtained from sub-DACs frequency responses $h_m(F)$. However, such direct measurement of sub-DACs frequency responses presents severe problems and is often simply impossible. The present disclosure effects circumstantial acquisition of the needed information by determination of the amplitudes and phases of spurious frequency components. The following calculations produce sub-DACs frequency responses $h_m(F)$ and, at last, the equalizing frequency responses $Eq_m(F)$.

Figure 2:
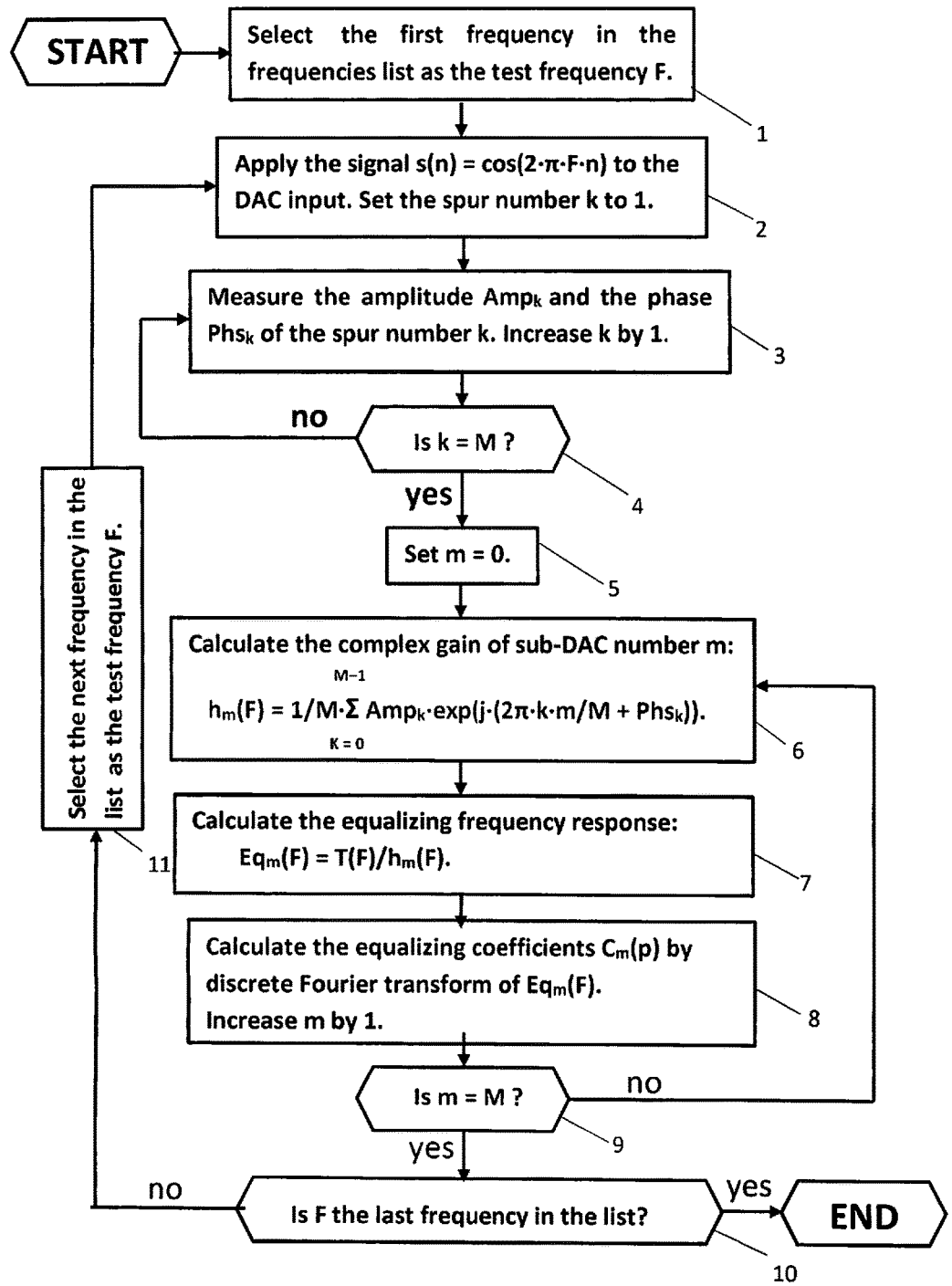
FIG. 2 shows a flow chart for the disclosure, that illustrates an exemplary method of equalizing frequency response misalignments in a time-interleaved DAC.

The set of operations performed in a time interleaved DAC with equalization of the disclosure in a calibration stage is illustrated by a flow chart, shown in FIG. 2.

As may be seen in the flow chart of FIG. 2, a calibration of the time interleaved DAC 10 is performed step by step, using one test frequency after another (from a list of test frequencies which are prepared in advance). The calibration begins with a first frequency of the list and ends with a last frequency.

At a calibration step, a test signal $s(n)=\cos(2\cdot\pi\cdot F\cdot n)$ is generated and applied to the DAC input 12. The corresponding analog output signal is analyzed, with the amplitude $Amp_k$ and phase $Phs_k$ being determined for each spur with the number k, 1≤k<M. The amplitude $Amp_0$ and the phase $Phs_0$ of the undistorted part of the signal are also measured.

The knowledge of the amplitudes $Amp_k$ and phases $Phs_k$ are used to calculate the complex gain $h_m$ for each sub-DAC with the number m by the use of the equation (2).

To make a transition from sub-DACs complex gain $h_m(F)$ to equalizing frequency responses $Eq_m(F)$, a target frequency response T(F) of the tandem connection equalizer-DAC is specified. To be a target response T(F), a response that equals 1 identically may be chosen, or one of the sub-DACs complex gains $h_m(F)$, or their average, or any function of F which is suitable in DAC intended applications. A set of required frequency responses $Eq_m(F)$ is then calculated by using the equation:

$$Eq_m(F)=T(F)/h_m(F). \quad (3)$$

Discrete Fourier transforms of required frequency responses $Eq_m(F)$ for different m, produce M sets of equalizing coefficients $C_m(p)$, where m corresponds to a set number and p, $0 \le p < L$, where p corresponds to a number of a coefficient in a set. An amount L of coefficients in a set is determined by a required accuracy of the equalization and a required level of spurs suppression. The so-determined sets of equalizing coefficients $C_m(p)$ are used in the operation mode of the interleaved DAC with equalization of the disclosure.

A DAC usually includes at its output, a low pass filter (LPF) for smoothing over the output analog signal and removing the corresponding distortions. Such a filter suppresses the spurs which fall within its stopband. Often the construction of a DAC does not permit a user to have access to the signal at the LPF input. In such an event, the amplitudes and the phases of the spurs in the LPF stopband cannot be measured. Incomplete information causes appearance of errors when calculating the equalization parameters with the equation (2), and the equalization brings about only a partial suppression of spurs.

To achieve a more significant level of spur suppression, the calibration is typically repeated, each time starting from the very beginning of the procedure. At the end of a suppression procedure, spurs amplitudes are measured anew and are used as a foundation for a decision of calibration continuation—and generally calibration is repeated as long as at least one spur is in excess of a prearranged threshold.

Figure 3:
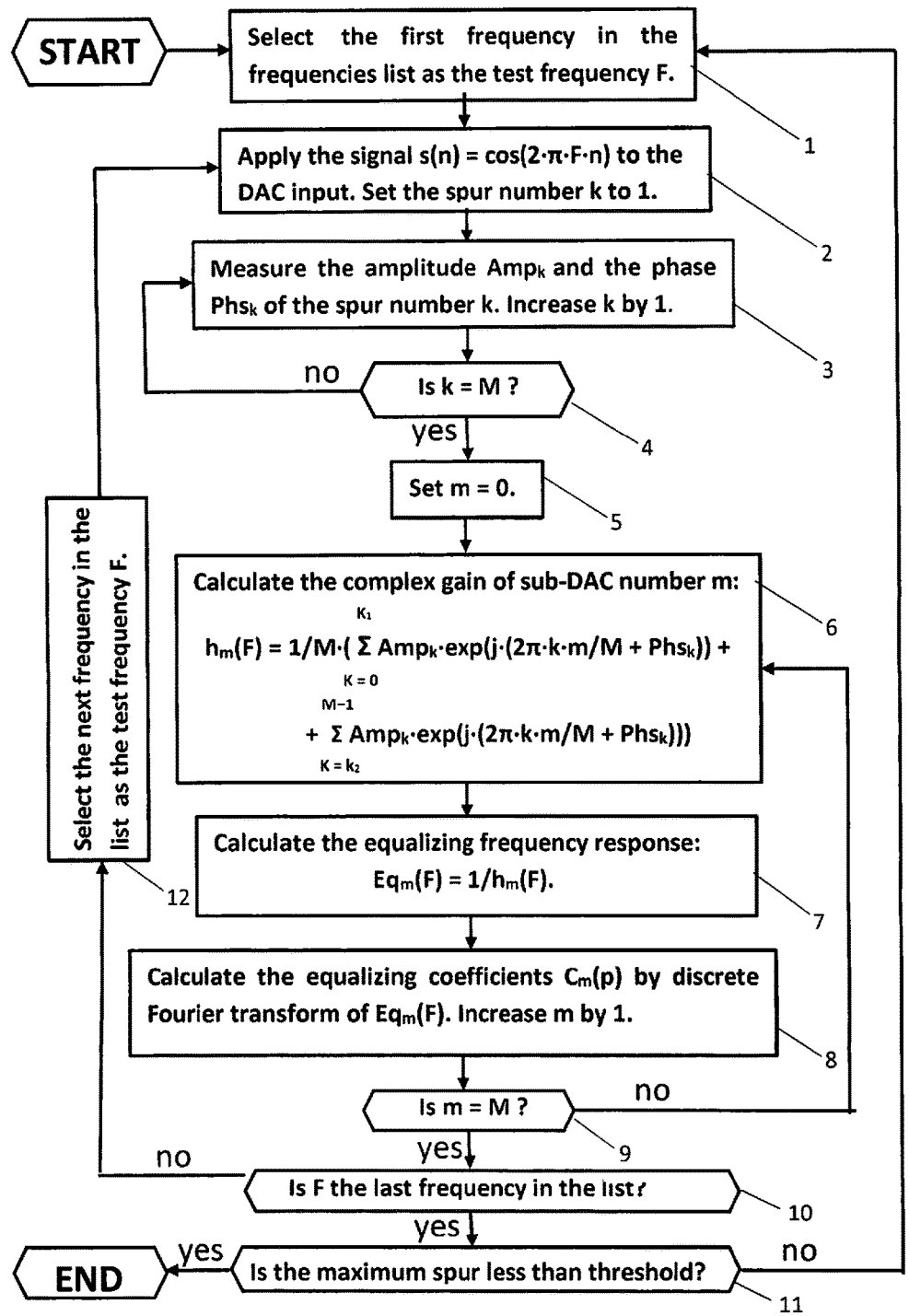
FIG. 3 shows a flow chart for the disclosure, that illustrates another exemplary method of equalizing frequency response misalignments in a time-interleaved DAC with a low pass filter.

A flow chart, which illustrates the sequence of operations for the case when some spurs are suppressed by LPF and are invisible, is shown in FIG. 3. This flow chart differs from the flow chart in FIG. 2 in several ways. First, a calculation of the sub-DACs complex gains $h_m(F)$ is performed with the use of the equation:

$$h_m(F) = 1/M \cdot \left( \sum_{k=0}^{k_1} Amp_k \cdot \exp(j \cdot (2\pi \cdot k \cdot m/M + Phs_k)) + \sum_{k=k_2}^{M-1} Amp_k \cdot \exp(j \cdot (2\pi \cdot k \cdot m/M + Phs_k)) \right)$$

where spurs with the numbers k in the interval $k_1 < k < k_2$ are supposed to be invisible. Second, after the calibration is repeated for all test frequencies F (from the first to the last), the remaining level of spurs is estimated, and a decision is made to continue the calibration or to stop it.

A reduction of the initial magnitude of spurs at the beginning of spurs suppression increases the extent of spurs suppression at its end. Therefore, the iterative procedure of spur suppression described above ends rapidly—usually after 2-4 iterations.

Often enough, economic considerations dictate the use of inexpensive measuring devices for DAC calibration. The measurement of output signal parameters then should be restricted by the use the most simple and inexpensive measuring devices, such as the simplest spectrum analyzers which are able to measure only signal amplitude spectrum.

According to the present disclosure, in a form, under the described circumstances, the spurs phases $Phs_k$ are determined using an approach: some auxiliary signals are applied to the DAC input, the amplitude of the spur produced at the DAC output by each auxiliary signal is measured, and measurement results are used for final calculation of $Phs_k$.

By way of example, the following method of spur phase detection is highly tolerant to measurements errors caused by noise and DAC non-linearity. This method is based on spur signal subtraction. The m-th sub-DAC transfer function corresponding to k-th spurious component $Spur(k) = Amp_k \cdot \exp(j \cdot Phs_k)$ is represented as:

$$h_{mk} = Amp_k \cdot \exp(j(2\pi \cdot m \cdot k/M + Phs_k)),$$

Using the processor network PN, for example, to find the unknown phase $Phs_k$ the following test signals $TS(\varphi)$ are formed, depending on a trial phase $\varphi$:

$$TS(m, \varphi) = \exp(j2\pi Fm) \cdot [1 - Amp_k \cdot \exp(j(2\pi \cdot m \cdot k/M + \varphi))],$$

where m=n mod M. The first term of the test signal generates spur signal $Spur(k) = Amp_k \cdot \exp(j \cdot Phs_k)$ due sub-DACs frequency response. The second term at the spur frequency results in complex vector $$RT(\varphi) = Amp_k \cdot \exp(j \cdot \varphi) \cdot \sum_{m=0}^{M-1} h_m(F)/M$$

The average of sub-DAC frequency responses does not depend on spur number k and has the same value for all spurious components. As a result, the output of test signal at a particular spur frequency equals to the sum of two vectors: $Spur(k)$ and $RT(\varphi)$. A magnitude of spectral component measured by spectrum analyzer is maximized when phases of $Spur(k)$ and $RT(\varphi)$ coincide and minimized when they are opposite. In an ideal case, an average sub-DAC frequency response is unity and when the trial phase is opposite to spur phase, the k-th spur magnitude is zero. To make detection more robust to noise and distortion, spur power (square of spectral magnitude), is measured using a spectrum analyzer. In this case, a dependence of the k-th spurious spectral component on test phase $\varphi$ is modulated as cosine of the phase difference between the spur and the test signal. A total spectrum power at the spur frequency in this case equals $Power(k, \varphi) = Spur(k)^2 + RT(\varphi)^2 + 2 \cdot Spur(k) \cdot R(\varphi) \cdot \cos(\varphi)$. Thus, making several measurements with pre-determined values of test phase $\varphi_1, \ldots \varphi_N$, in the range of 0 to $2 \cdot \pi$, a spur phase is found by a standard quadrature detection method, well known in the prior art.

The method of spur phase detection described above is not sensitive to amplitude errors since minimum phase location does not change. A phase of a reference vector may deviate from zero so that all spur phases are determined with constant phase offset. This frequency-independent phase offset results in a constant phase shift of DAC frequency responses and does not affect accuracy of spur correction. Usually all sub-DAC frequency responses are normalized relative to one (e.g. the first) sub-DAC which eliminates the phase offset. In a form, in a high SNR environment, for example, only three trial phase values $\varphi$ may be required for a spur phase calculation. However, in a low SNR environment, use of more trial phase measurements will provide increased accuracy.

In a form, an additional amplitude adjustment step may be used to correct non-linearity of a DAC response. Once a spur phase is found, additional measurements may be performed, aimed to force residual spur magnitude to zero (or a device noise floor level). This is done by generating plurality of test signals with a variable compensating spur amplitude and minimizing spectral magnitude at a spur frequency. Minimization can be done using standard methods well known in the prior art, such as a steepest descent or golden section search.

Another method of spur phase detection that requires only three test signals and relies on ratio of spur amplitudes, may be preferable in some circumstances. In this method, a first auxiliary signal is built as a harmonic signal with a test frequency F and an envelope $P_{in}(n)=\exp(j2\pi \cdot m \cdot k/M)$, where m=n Mod M. After passing through the DAC, each sample of the signal is multiplied by a complex gain $h_m(F)$ of the sub-DAC with the number m so that an output envelope equals $P_{out}(n)=h_m(F) \cdot \exp(j2\pi \cdot m \cdot k/M)$. According to equation (1) above, the complex amplitude $H_k$ of the spur with the number k in this case equals:

$$H_k = \sum_{m=0}^{M-1} P_{out}(n) \cdot \exp(-j2\pi \cdot k \cdot m/M) = \sum_{m=0}^{M-1} h_m(F) \cdot \exp(j2\pi \cdot m \cdot k/M) \cdot$$

$$\exp(-j2\pi \cdot k \cdot m/M) =$$

$$= 1/M \cdot \sum_{m=0}^{M-1} h_m(F).$$

The last expression does not contain the spur number k and is the same for all spurs. In the following calculations, the vector $$R = 1/M \cdot \sum_{m=0}^{M-1} h_m(F)$$

is used as a reference vector. A measurement by an available spectrum analyzer at the output of the DAC, produces the amplitude |P| of this reference vector.

Figure 4A:
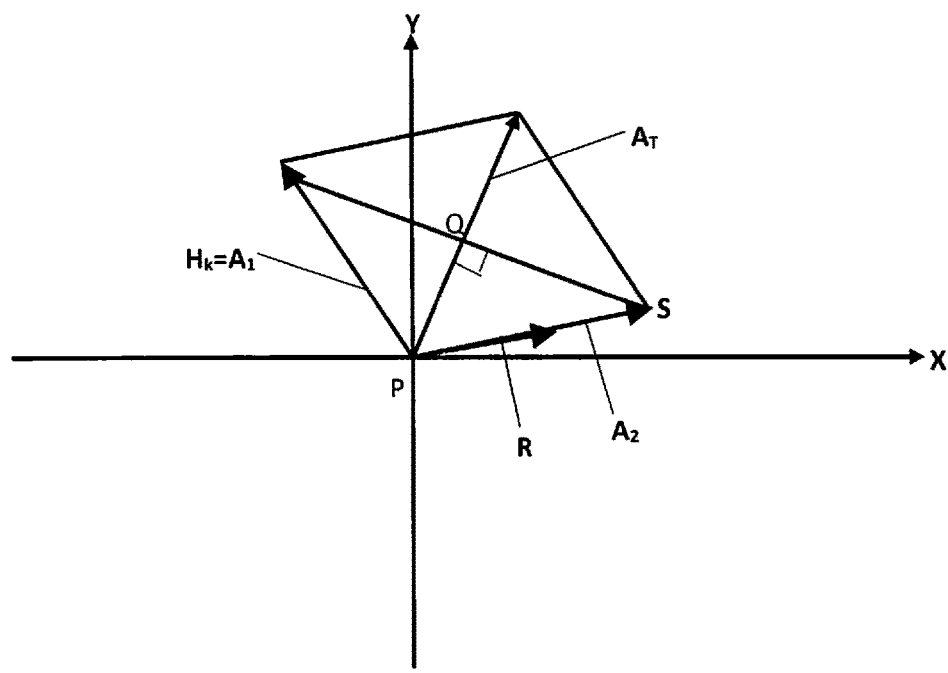
FIGS. 4A and 4B illustrate an exemplary measurement of a spur phase.

The second auxiliary signal is built as a harmonic signal with the test frequency F and the envelope $P_{in}(n)=1+(Amp_k/|R|) \cdot R$. When the signal with such an envelope is applied to the DAC input, a spur with the number k appears at the DAC output among other spurs. The total complex amplitude $A_T$ of this spur is a sum of two addends: $A_T=A_1+A_2$. The first addend $A_1$ is caused by a unit part of the envelope so that its complex amplitude equals the complex amplitude $H_k$ with a modulus $Amp_k$. A second addend $A_2$ is caused by a second part of the envelope. Its complex amplitude is directed along the reference vector R and has a modulus $|Amp_k \cdot |R|/|R|=Amp_k$. Thus, $|A_1|=|A_2|$. The composition of these two addends is illustrated in FIG. 4a. In this diagram, a sum $A_T$ of the two addends is shown as a diagonal of a parallelogram with the sides $A_1$ and $A_2$. Since $|A_1|=|A_2|$, the parallelogram is a rhomb with perpendicular diagonals. The phase $Phs_k$ of the initial spur equals the angle between vector $A_1$ and a reference vector R, where the angle is equal to a doubled angle between the diagonal of a parallelogram and its side. From the right-angled triangle PQS, the last angle equals a $\cos(|A_T|/(2*Amp_k))$. After measuring the total amplitude $|A_T|$, a modulus of the phase $Phs_k$ is calculated using the equation $$|Phs_k|=2 \cdot a \cos(|A_T|/(2*Amp_k)).$$

Figure 4B:
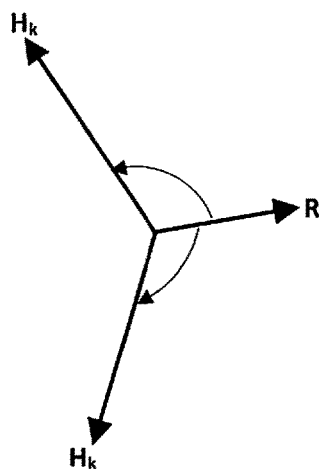

The vector $H_k$ may be located in one of two position relative to the vector R (see FIG. 4b). The angles between vectors $H_k$ and R in these two positions differ in sign. However, the preceding procedure makes it possible to find in either case only the modulus of the angle. To remove the ambiguity a third auxiliary signal is applied to the DAC input, for example, by processor network PN. This signal is built as a harmonic signal with a test frequency F and an envelope $P_{in}(n)=1+R \cdot \exp(j \cdot \pi/2)/|R|$. A spur produced by such a signal, is a sum of a vector with the complex amplitude $H_k$ and a vector caused by a second part of the envelope which is directed perpendicular to the reference vector R. When the vector $H_k$ is located counter-clockwise with respect to the vector R, the modulus of the sum $A_T$ is larger than the amplitude $Amp_k$ of the vector $A_1$. When the vector $H_k$ is located clockwise with respect to the vector R, the modulus of sum $A_T$ is less than the amplitude $Amp_k$ of the vector $A_1$. These considerations lead to the unambiguous rule of the spur phase determination:

$$Phs_k=2 \cdot a \cos(|A_T|/(2*Amp_k)), \text{ if } |A_T|>Amp_k, \text{ and}$$

$$Phs_k=-2 \cdot a \cos(|A_T|/(2*Amp_k)), \text{ else.}$$

Once the spurs phases $Phs_k$ have been determined (in addition to the direct measurement of spurs amplitudes $Amp_k$), the complex gains $h_m(F)$ of the sub-DACs are calculated by the use of the equation (2), and equalizing complex gains $Eq_m(F)$ are found with the use of the equation (3). In this manner, the measurement of spurs phases $Phs_k$ and a calibration of a time interleaved DAC with the use of a spectrum analyzer capable of measuring the amplitude spectrum only, is made possible.

Figure 5:
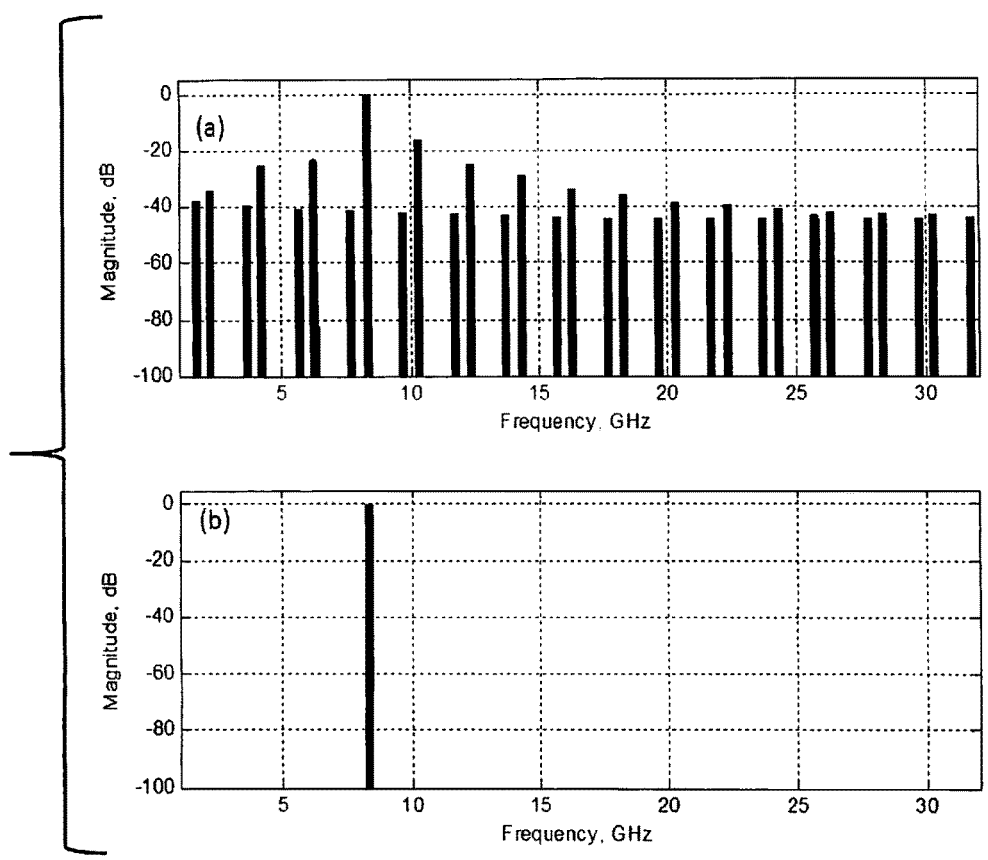
FIG. 5 (parts a and b) and FIG. 6 (parts a, b and c), show for the disclosure, examples of results of operation simulation for a time-interleaved DAC with equalization.
Figure 6:
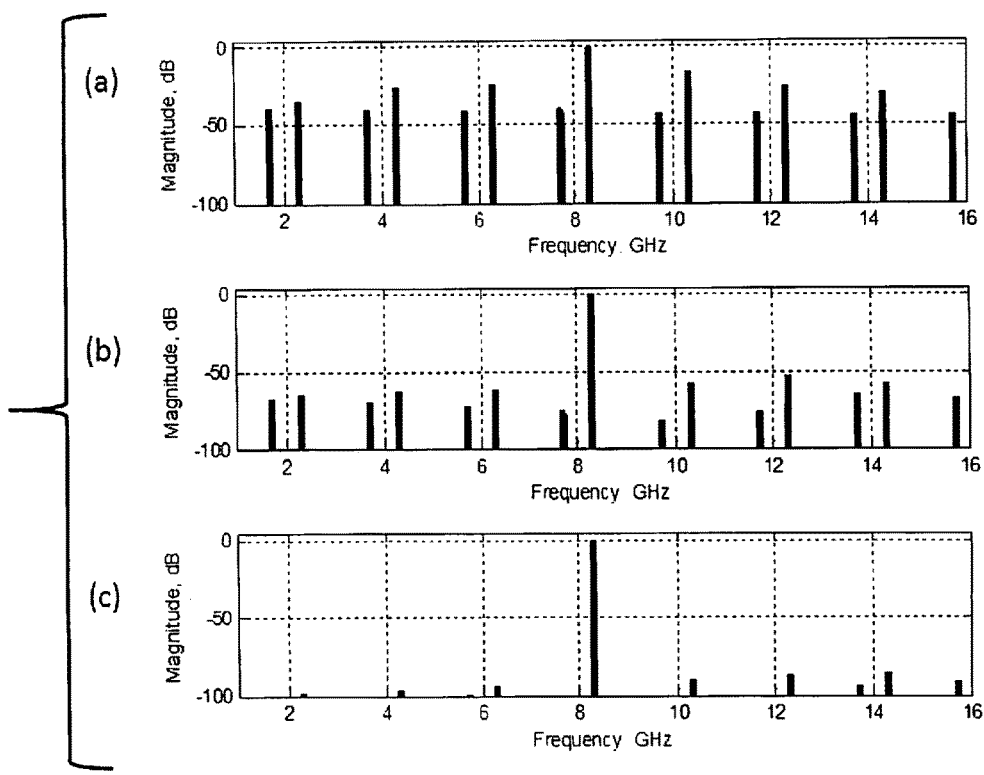

As an illustration, FIGS. 5-8 show results of a software simulation and hardware tests of a time interleaved DAC with equalization according to the present disclosure. FIG. 5 shows an input spectrum (in part a) and an output spectrum (in part b) of a simulated time interleaved DAC with equalization (32 sub-DACs with 64 Gs/s sampling rate). Sub-DACs frequency responses were measured using all 32 spurs, resulting in ideal suppression of spurious components (below −100 dB level). FIG. 6 shows a result of a two-pass interleaved DAC simulation, when an output spectrum bandwidth is limited by 13 GHz. The input signal spectrum shown in FIG. 6 (in part a) results in a one-pass equalization on (as shown in part b). Most spurs are suppressed below −65 dB level, and after a second iteration of equalization (as show in part c), residual spurs are reduced below −90 dB.

Figure 7A:
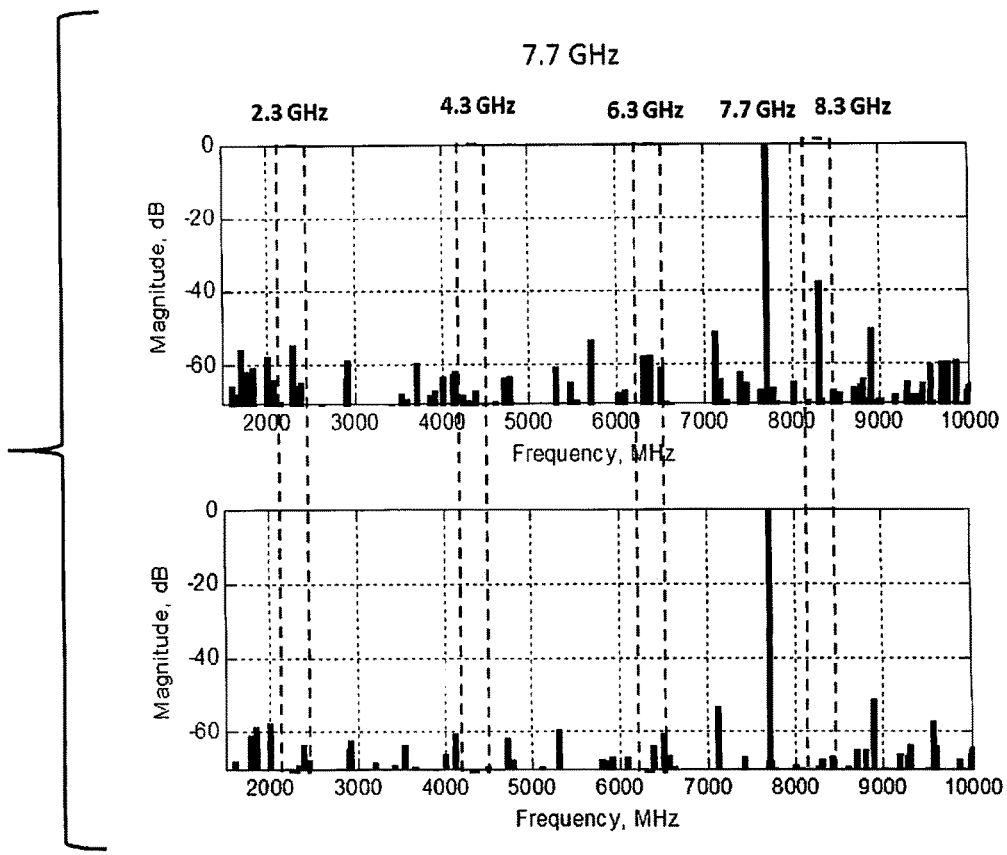
FIGS. 7A, 7B, and 7C, and FIG. 8 (parts a and b) show for the disclosure, results of experimental tests of a time-interleaved DAC with equalization.
Figure 7B:
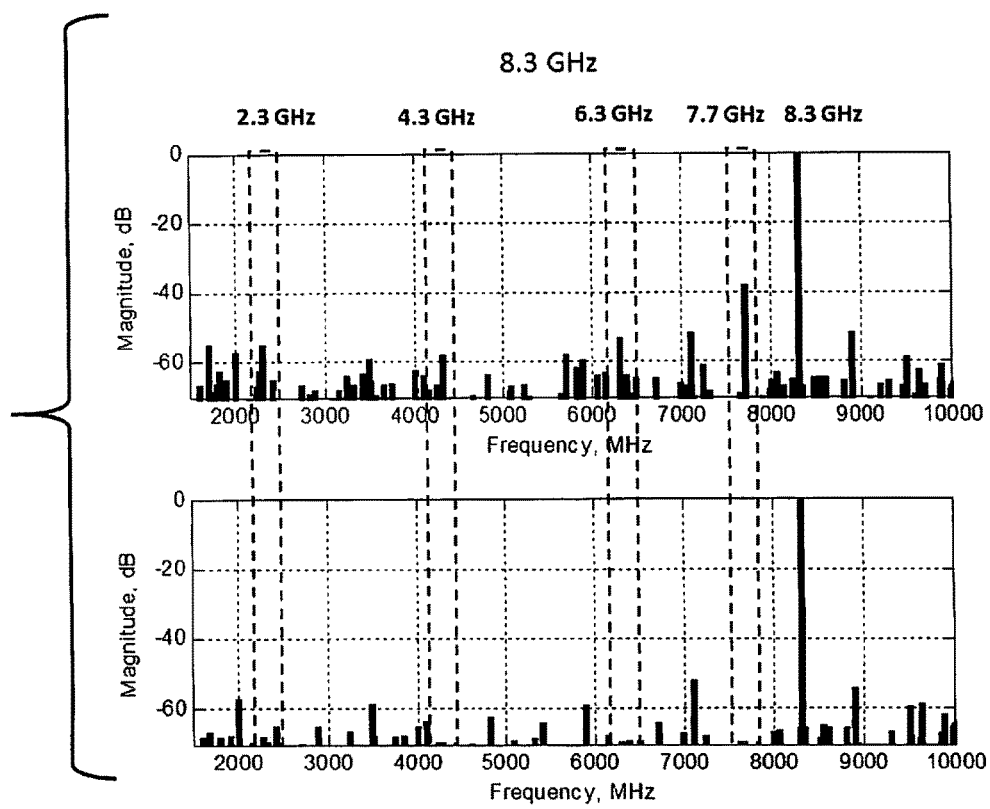
Figure 7C:
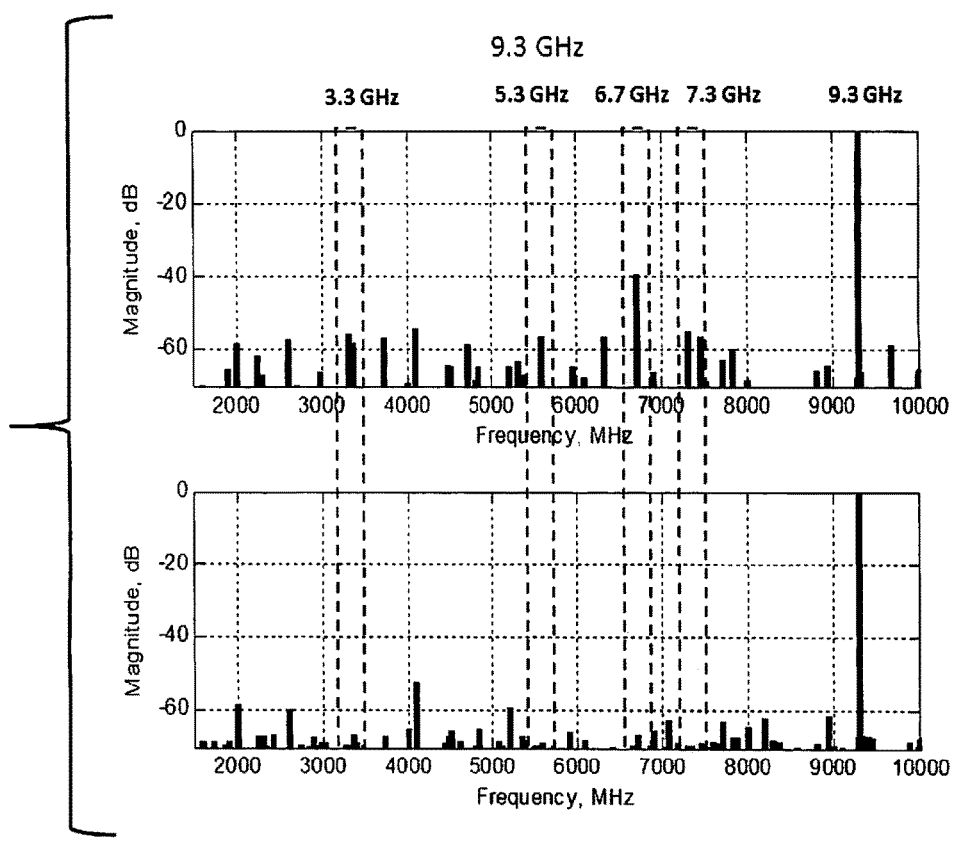

FIGS. 7A, 7B, 7C show comparisons of experimental signal sine wave spectrums generated by a Keysight AWG 8195 signal generator before and after sub-DACs equalization. After sub-DACs responses were measured, an equalizer with 159 taps was used to pre-distort AWG signal prior to loading it to the AWG 8195 signal generator. Sine wave signals at 7.7, 8.3 and 9.3 GHz spectrum were measured without (top graphs in FIGS. 7A, 7B and 7C), and with (bottom graphs in FIGS. 7A, 7B and 7C), DAC equalization. The spectrum contains multiple low-level spurs caused by the interleaved DAC structure (32 sub-DACs) and non-linear distortions. The suppressed sub-DAC spurs are highlighted by gray boxes. Strong reflection (up to −38 dB spur magnitude) occurs from frequency response misalignments between four groups of sub-DACs, generating a biggest spur at 16 GHz—center frequency. After equalization, this spur is suppressed below −70 dB level. Other sub-DAC spurs are smaller and occur at 2 GHz steps. Most of these minor spurs are also suppressed below −70 dB level.

Figure 8:
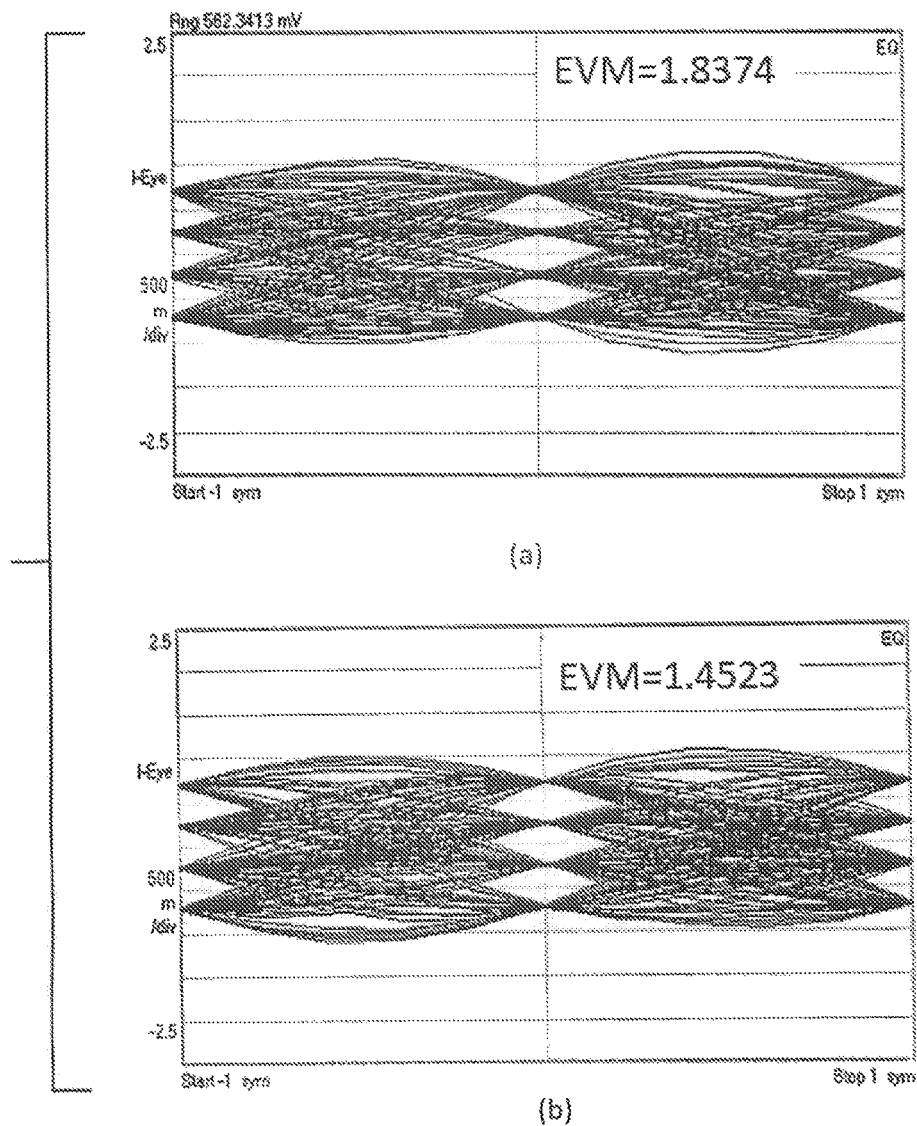

The sub-DAC equalization impact on wideband modulated signals was evaluated by generating 1 GHz wide QAM16 signal using the AWG8195 signal generator at 64 Gs/s sampling rate. Error vector magnitude (EVM) measurement was performed using Keysight 89600 VSA software integrated with Guzik Technical Enterprises ADP700 series 32 GS/s digitizer. When modulated QAM16 signal is centered at 8 GHz and a channel frequency response is compensated by an adaptive equalizer, the best EVM equals 1.83%. Sub-DACs equalization reduces EVM to 1.45% (0.38% improvement). This EVM gain is caused by suppression of big reflection occurring in the vicinity of 8 GHz region due to reflection from 16 GHz frequency shown in FIGS. 7A, 7B and 7C. Signal quality improvement can also be seen on eye-diagrams, for example, as shown at FIG. 8 (in part a for EVM=1.83% and in part b for EVM=1.45%). In part a and part b of FIG. 8, the equalized signal (bottom eye-diagram) have better eye opening than the non-equalized signal (top eye-diagram).

Although the foregoing description of the embodiment of the present technology contains some details for purposes of clarity of understanding, the technology is not limited to the detail provided. There are many alternative ways of implementing the technology. The disclosed embodiment is illustrative and not restrictive.

What is claimed is:

1. A method of equalization of a time-interleaved digital to analog converter (DAC) having a demultiplexer, M sub-DACs, where M is an integer, a combiner and a filter coupled in series between a digital DAC input for receiving a digital input DAC signal-to-be-processed, and an analog DAC output, wherein the DAC input is coupled to the demultiplexer which is adapted in response to the applied input DAC signal, to provide demultiplexed digital signals to respective inputs of the sub-DACs, and wherein in response to a succession of mutually time-shifted sampling signals, outputs of the M sub-DACs are coupled to inputs of the combiner, wherein the combiner is adapted to combine the signal inputs of the combiner to establish an analog signal and pass the resultant combined signal through the filter to the analog DAC output, comprising the steps of:

A) in a calibration mode performed step by step,
    i) for each step:
      a) choosing a test frequency F is from a list of test frequencies;
      b) generating a test signal at the chosen test frequency, and applying the test signal to the DAC input of the time-interleaved DAC;
      c) measuring amplitudes $Amp_k$ and phases $Phs_k$ of spurious components in an output signal at the DAC output, wherein k is an integer, $0 \leq k < M$, associated with the respective spurious components;
      d) calculating M complex values of sub-DAC gains $h_m(F)$ of the respective sub-DACs for each m, wherein m is an integer, $0 \leq m < M$, associated with the respective M sub-DACs, according to equations:

$$h_m(F) = 1/M \cdot \sum_{k=0}^{M-1} Amp_k \cdot \exp(j \cdot (2\pi \cdot k \cdot m/M + Phs_k));$$

e) specifying a target frequency response T(F) of a tandem connection equalizer—DAC;
      f) calculating M complex values of equalizing gains $Eq_m(F)$ for each m, according to equations:

$Eq_m(F)=T(F)/h_m(F)$;

ii) accumulating equalizing gains $Eq_m(F)$ for different test frequencies F of the respective steps, forming required equalizing frequency responses;

iii) calculating M sets of equalizing coefficients $C_m(p)$ at the end of the calibration stage by performing discrete Fourier transforms on the required equalizing frequency responses $Eq_m(F)$, wherein each $C_m(p)$ set includes L coefficient elements, and is associated with a respective one of the M sub-DACs, and wherein p is an integer, $0 \leq p < L$, associated with a respective one of the L coefficient elements in a set; and B) in an operation mode:
    i) transforming an input digital signal $s_{in}(n)$ applied to the DAC input into an equalized digital signal E(n), wherein a sample with the number n of the equalized digital signal is produced by a convolution of a set of equalizing coefficients $C_m(p)$, m=n mod M, with a corresponding part of the input digital signal:

$$E(n) = \sum_{i=0}^{L-1} C_m(i) \cdot s_{in}(n-i);$$

ii) applying the equalized digital signal to the input of the DAC, whereby the digital signal is converted into the analog signal at the analog DAC output.

2. The method of equalization of claim 1, wherein the measuring sub-step A.i.c of the calibration mode is performed with a measuring device, wherein the measuring device is a spectrum analyzer adapted for producing an amplitude spectrum of an output signal at the analog DAC output, wherein amplitudes $Amp_k$ of spurious components at the DAC output are measured directly by the spectrum analyzer and phases $Phs_k$ of the spurious components at the DAC output are determined by a procedure whereby auxiliary signals are applied to the DAC input, amplitudes of a spur produced at the DAC output by each auxiliary signal are measured, and the measurement results are used for calculation of $Phs_k$.

3. The method of equalization of claim 2, wherein the phases $Phs_k$ of the spurious components at the DAC output are determined for each k, $0 \leq k < M$, using a plurality of auxiliary test signals of the form:

$TS(m, \phi_i) = \exp(j2\pi Fm) \cdot [1 - Amp_k \cdot \exp(j(2\pi \cdot m \cdot k/M + \phi_i)]$, where m is sub-DAC number, $Amp_k$ is amplitude of spurious component with number k and $\phi_i$ is trial phase, wherein phase of the spurious component is determined as phase minimizing spectrum magnitude.

4. The method of equalization of claim 3, wherein the phase $Phs_k$ of the spurious components are calculated by using plurality of squared spectrum magnitudes of signal $TS(m, \phi_i)$ by means of quadrature detection.

5. The method of equalization of claim 3, wherein after spur phase $Phs_k$ is determined, amplitude of the spurious component $Amp_k$ is adjusted to minimize total spur magnitude at given frequency.

6. The method of equalization of claim 3, wherein the phases $Phs_k$ of the spurious components at the DAC output being determined by a procedure comprising:

A) a test with a first auxiliary signal, whereas:
    a) the first auxiliary signal is generated as a harmonic signal with the test frequency F and an envelope $1/M \cdot \exp(j \cdot 2\pi \cdot k \cdot m/M)$, m=n mod m·n being the number of a sample in the first auxiliary signal;

b) the first auxiliary signal is applied to the DAC input;
c) the modulus $A_1$ of the spurious component with the number k in the signal at the DAC output is measured by the spectrum analyzer;
B) a test with a second auxiliary signal, whereas:
a) the second auxiliary signal is generated as a harmonic signal with the test frequency F and an envelope $1+Amp_k/|A_1|\cdot R$;
b) the second auxiliary signal is applied to the DAC input;
c) the modulus $A_2$ of the spurious component with the number k in the signal at the DAC output is measured by the spectrum analyzer;
C) a test with a third auxiliary signal, whereas:
a) the third auxiliary signal is generated as a harmonic signal with the test frequency F and an envelope $1+Amp_k/|R|\cdot \exp(j\cdot \pi/2)\cdot R$;
b) the third auxiliary signal is applied to the DAC input;
c) the modulus $A_3$ of the spurious component with the number k in the signal at the DAC output is measured by the spectrum analyzer;
D) the phase $Phs_k$ is calculated with the use of equations:

$Phs_k = 2\cdot a\ \cos(A2/2/Amp_k)$ if $A_3 \leq A2$, and $Phs_k = -2\cdot a\ \cos(A2/2/Amp_k)$ otherwise.

7. The method of equalization of claim 1, wherein the DAC incorporates a low pass filter to perform a step of suppressing spurs with numbers from $k_1$ to $k_2$, and thereby eliminating the use of corresponding information for determination of the sub-DACs gains $h_m(F)$ according the equation:

$Eq_m(F)=T(F)/h_m(F)$.

whereby a determination of the sub-DACs gains $h_m(F)$ is performed as a set of consecutive iterations, each iteration step comprising:

a) a generating a test signal of the chosen test frequency F;
b) applying the test signal to the DAC input;
c) measuring amplitudes $Amp_k$ and phases $Phs_k$ with the numbers k of the visible spurious components in the signal at the DAC output, said numbers satisfying the inequalities $0\leq k<k_1$ or $k_1<k<M$;
d) calculating the sub-DACs gains $h_m(F)$ by the use of the next equations:

$$h_m(F) = 1/M \cdot \sum_{k=0}^{k_1-1} Amp_k \cdot \exp(j\cdot(2\pi\cdot k\cdot m/M + Phs_k)) +$$

$$1/M \cdot \sum_{k=k_2}^{M-1} Amp_k \cdot \exp(j\cdot(2\pi\cdot k\cdot m/M + Phs_k));$$

e) specifying a target frequency response T(F) of the tandem connection equalizer-DAC;
f) calculating M complex values of equalizing gains $Eq_m(F)$ using the equation:

$Eq_m(F)=T(F)/h_m(F)$;

g) accumulating equalizing gains $Eq_m(F)$ for different test frequencies F, thereby forming equalizing frequency responses;
h) calculating M sets of equalizing coefficients $C_m(p)$ at the end of the calibration stage by discrete Fourier transforms of required equalizing frequency responses $Eq_m(F)$, wherein m is a set number and p, $0\leq p<L$, is a number of a coefficient in a set.

8. The method of equalization of claim 6, including the further step of repeating the iterative calculation of equalizing coefficients $C_m(p)$ while at least one spur remains above a previously set threshold.

* * * * *